United States Patent
Yoon et al.

(10) Patent No.: US 8,558,235 B2
(45) Date of Patent: Oct. 15, 2013

(54) ORGANIC LIGHT EMITTING DIODE DISPLAY AND MANUFACTURING METHOD THEREOF

(75) Inventors: Ju-Won Yoon, Yongin (KR); Il-Jeong Lee, Yongin (KR); Choong-Youl Im, Yongin (KR); Young-Dae Kim, Yongin (KR); Jong-Mo Yeo, Yongin (KR); Do-Hyun Kwon, Yongin (KR); Cheol-Ho Yu, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 282 days.

(21) Appl. No.: 13/036,502

(22) Filed: Feb. 28, 2011

(65) Prior Publication Data
US 2011/0220898 A1    Sep. 15, 2011

(30) Foreign Application Priority Data
Mar. 9, 2010   (KR) .......................... 10-2010-0020998

(51) Int. Cl.
*H01L 29/04*   (2006.01)
(52) U.S. Cl.
USPC ................. 257/59; 257/40; 257/98; 257/642; 257/E29.003; 257/E51.001
(58) Field of Classification Search
USPC ............. 257/40, 98, 642–643, 759, E39.007, 257/E51.001–51.052, E27.117–27.119
See application file for complete search history.

(56) References Cited

U.S. PATENT DOCUMENTS

| | | | |
|---|---|---|---|
| 2008/0191613 A1 | 8/2008 | Goh et al. | |
| 2009/0176326 A1 | 7/2009 | Tseng | |
| 2010/0022055 A1 | 1/2010 | Bae et al. | |
| 2010/0045173 A1 * | 2/2010 | Kwon et al. | 313/504 |

FOREIGN PATENT DOCUMENTS

| KR | 10-2005-0094074 | 9/2005 |
|---|---|---|
| KR | 1020050105852 | 11/2005 |
| KR | 10-2007-0068092 | 6/2007 |
| KR | 1020070065551 | 6/2007 |
| KR | 100787461 B1 | 12/2007 |
| KR | 10-2008-0023904 | 3/2008 |
| KR | 1020100022406 | 3/2010 |

OTHER PUBLICATIONS

English translation of Korean Publication No. 1020060111245 of record.*

* cited by examiner

*Primary Examiner* — Mamadou Diallo
(74) *Attorney, Agent, or Firm* — Robert E. Bushnell, Esq.

(57) ABSTRACT

An organic light emitting diode (OLED) display that includes a substrate, a thin film transistor, and a pixel electrode. The thin film transistor is formed on the substrate and includes a semiconductor layer, a gate electrode, a source electrode, and a drain electrode. The pixel electrode is electrically connected to the thin film transistor and is formed on the same layer as the source electrode and the drain electrode. The source electrode and the drain electrode include a first conductive layer, and the pixel electrode includes a first conductive layer and a second conductive layer stacked thereon.

20 Claims, 9 Drawing Sheets

ORGANIC LIGHT EMITTING DIODE DISPLAY AND MANUFACTURING METHOD THEREOF

CLAIM OF PRIORITY

This application makes reference to, incorporates the same herein, and claims all benefits accruing under 35 U.S.C. §119 from an application earlier filed in the Korean Intellectual Property Office on the 9 Mar. 2010 and there duly assigned Serial No. 10-2010-0020998.

BACKGROUND OF THE INVENTION

1. Field of the Invention

The general inventive concept relates to an organic light emitting diode (OLED) display and a manufacturing method.

2. Description of the Related Art

In general, an active organic light emitting diode (OLED) display includes an organic light emitting diode for emitting light and a thin film transistor for driving the organic light emitting diode. A number of processes using a mask are required in order to form electrodes configuring the organic light emitting element and the thin film transistor and wires for connecting them on a substrate.

The above information disclosed in this Related Art section is only for enhancement of understanding of the background of the described technology and therefore it may contain information that does not form the prior art that is already known in this country to a person of ordinary skill in the art.

SUMMARY OF THE INVENTION

The described technology has been made in an effort to provide an organic light emitting diode (OLED) display that is manufactured by a simplified manufacturing process and is assigned characteristics needed for respective electrodes, and a manufacturing method thereof.

Aspects of the present invention provide for an organic light emitting diode display including a substrate, a thin film transistor, and a pixel electrode.

The thin film transistor may be formed on the substrate and includes a semiconductor layer, a gate electrode, a source electrode, and a drain electrode.

The pixel electrode may be electrically connected to the thin film transistor and is formed on the same layer as the source electrode and the drain electrode.

In this instance, the source electrode and the drain electrode include a first conductive layer, and the pixel electrode includes a first conductive layer and a second conductive layer stacked thereon.

The semiconductor layer may be formed on the substrate, a gate insulation layer is formed while covering the semiconductor layer, and the gate electrode is formed in a channel region of the semiconductor layer with the gate insulation layer therebetween.

An inter-layer insulation layer may be formed while covering the gate electrode, and the source electrode, the drain electrode, and the pixel electrode are formed on the inter-layer insulation layer.

The source electrode and the drain electrode may be configured by the first conductive layer.

The first conductive layer includes at least one of aluminum, copper, molybdenum, titanium, titanium nitride, and alloys thereof.

The first conductive layer may be formed by sequentially stacking a first titanium layer, an aluminum layer, and a second titanium layer.

The second conductive layer includes at least one of a transparent conductive material, silver, aluminum, titanium, nickel, and alloys thereof.

The second conductive layer may be formed by sequentially stacking a first indium tin oxide (ITO) layer, a silver layer, and a second indium tin oxide layer.

Another aspect of the present invention provides a method for manufacturing an organic light emitting diode display, wherein when the source electrode, the drain electrode, and the pixel electrode may be formed, the source electrode and the drain electrode may be formed with a first conductive layer on the substrate, and the pixel electrode is formed with the first conductive layer and a second conductive layer may be stacked on the first conductive layer.

The method includes, before the forming of the source electrode, the drain electrode, and the pixel electrode: forming the semiconductor layer on the substrate; forming a gate insulation layer while covering the semiconductor layer; forming the gate electrode in a channel region of the semiconductor layer with the gate insulation layer therebetween; forming an inter-layer insulation layer while covering the gate electrode; and forming a contact hole for revealing a source region and a drain region of the semiconductor layer on the inter-layer insulation layer and the gate insulation layer.

The forming of the source electrode, the drain electrode, and the pixel electrode includes: forming the first conductive layer on the inter-layer insulation layer to contact the source region and the drain region of the semiconductor layer through the contact holes; forming the second conductive layer on the first conductive layer; and patterning the first conductive layer and the second conductive layer.

The patterning of the first conductive layer and the second conductive layer may use a photosensitive layer pattern formed by halftone exposure.

The photosensitive layer pattern may correspond to a part in which the source electrode and the drain electrode will be formed, and includes a first part having a first thickness, a second part corresponding to a part in which the pixel electrode may be formed and having a second thickness that may be thinner than the first part, and a third part for exposing the second conductive layer.

The patterning of the first conductive layer and the second conductive layer includes: forming the photosensitive layer pattern on the second conductive layer; etching and removing the first conductive layer and the second conductive layer corresponding to the third part; removing a photosensitive layer pattern of the second part; and etching and removing the second conductive layer corresponding to the second part.

The first conductive layer includes at least one of aluminum, copper, molybdenum, titanium, titanium nitride, and alloys thereof.

The first conductive layer may be formed by sequentially stacking a first titanium layer, an aluminum layer, and a second titanium layer.

The second conductive layer includes at least one of a transparent conductive material, silver, aluminum, titanium, nickel, and alloys thereof.

The second conductive layer may be formed by sequentially stacking a first indium tin oxide layer, a silver layer, and a second indium tin oxide layer.

The organic light emitting diode (OLED) display according to the exemplary embodiment can have the characteristics needed by the respective electrodes by differentiating the stacked configurations of the source and drain electrodes and the pixel electrode that are formed on the same layer. That is, the pixel electrode may have the stacked structure of the first conductive layer and the second conductive layer to improve the light emitting characteristic, and the source and drain electrodes are formed by the first conductive layer to prevent corrosion of a pad.

The method for manufacturing an organic light emitting diode (OLED) display according to the exemplary embodiment forms the source and drain electrodes and the pixel electrode having different stacked structures by the halftone exposure process using a mask, and hence, it is possible to assign needed characteristics to the respective electrodes without increasing the number of masks that are responsible for a large portion of production cost.

Further, the organic light emitting diode (OLED) display may be manufactured by forming the source and drain electrodes and the pixel electrode on the same layer and reducing the number of masks used for the entire process.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
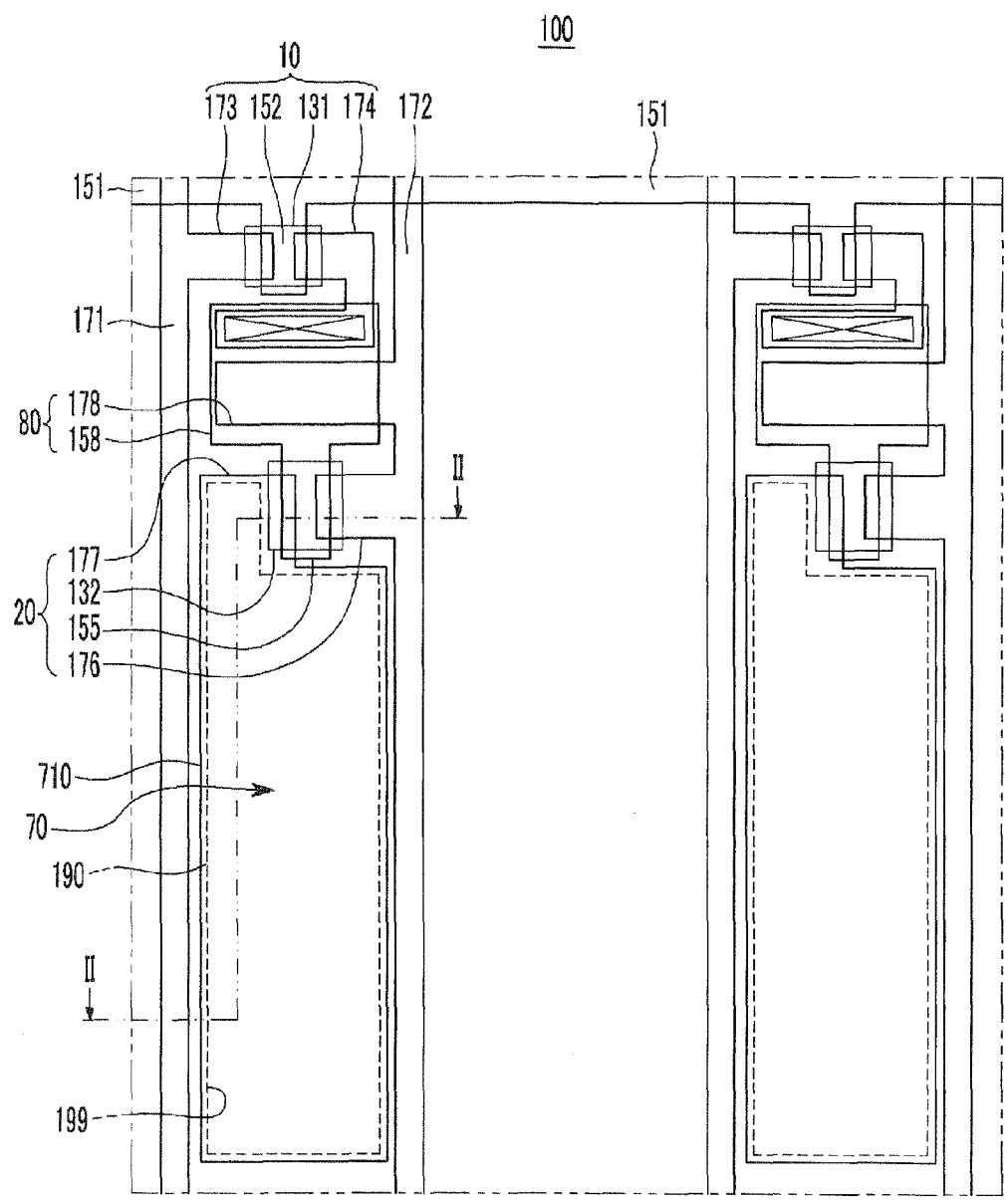
FIG. 1 is a layout view of an organic light emitting diode (OLED) display according to an exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the principles for the present invention.

The drawings and description are to be regarded as illustrative in nature and not restrictive. Like reference numerals designate like elements throughout the specification. It will be understood that when an element such as a layer, film, region, or substrate is referred to as being "on" another element, it can be directly on the other element or intervening elements may also be present. Alternatively, when an element is referred to as being "directly on" another element, there are no intervening elements present.

Furthermore, in the accompanying drawings, although an active matrix (AM) type of organic light emitting diode display having a structure that is provided with two thin film transistors (TFTs) and one storage capacitor in one pixel is shown, exemplary embodiments are not limited thereto. Accordingly, the organic light emitting diode display may be provided with three or more thin film transistors and two or more storage capacitors in one pixel. Herein, the pixel represents a minimum unit displaying an image, and the organic light emitting diode display displays the image by means of a plurality of pixels.

Recognizing that sizes and thicknesses of constituent members shown in the accompanying drawings are arbitrarily given for better understanding and ease of description, the present invention is not limited to the illustrated sizes and thicknesses.

In the drawings, the thickness of layers, films, panels, regions, etc., are exaggerated for clarity. Like reference numerals designate like elements throughout the specification. In order to clarify the present invention, elements extrinsic to the description are omitted from the details of this description, and like reference numerals refer to like elements throughout the specification.

In several exemplary embodiments, constituent elements having the same configuration are representatively described in a first exemplary embodiment by using the same reference numeral and only constituent elements other than the constituent elements described in the first exemplary embodiment will be described in other embodiments.

In general, since the mask has a pattern for an object (e.g., an organic light emitting diode) to be formed and the process using the mask is very important in the production cost, the production cost is increased and productivity is deteriorated as the number of masks used in the whole process is increased. Recently, manufacturing methods for reducing the number of masks have been required as more complicated configuration for improving characteristics of the organic light emitting diode (OLED) display and efficiently using electrodes and wires has been adopted.

However, when many electrodes are formed with one mask to reduce the total number of masks, the respective electrodes and wires are configured with the same structure and material whereas the respective electrodes require different characteristics, and hence it is difficult to individually assign the characteristics needed for the respective electrodes. Accordingly, the organic light emitting diode (OLED) display manufactured by the process in which the number of masks is reduced can have low luminous efficiency and can generate a high driving voltage.

An organic light emitting diode (OLED) display 100 according to an exemplary embodiment will now be described with reference to FIG. 1 and FIG. 2.

Figure 2A:
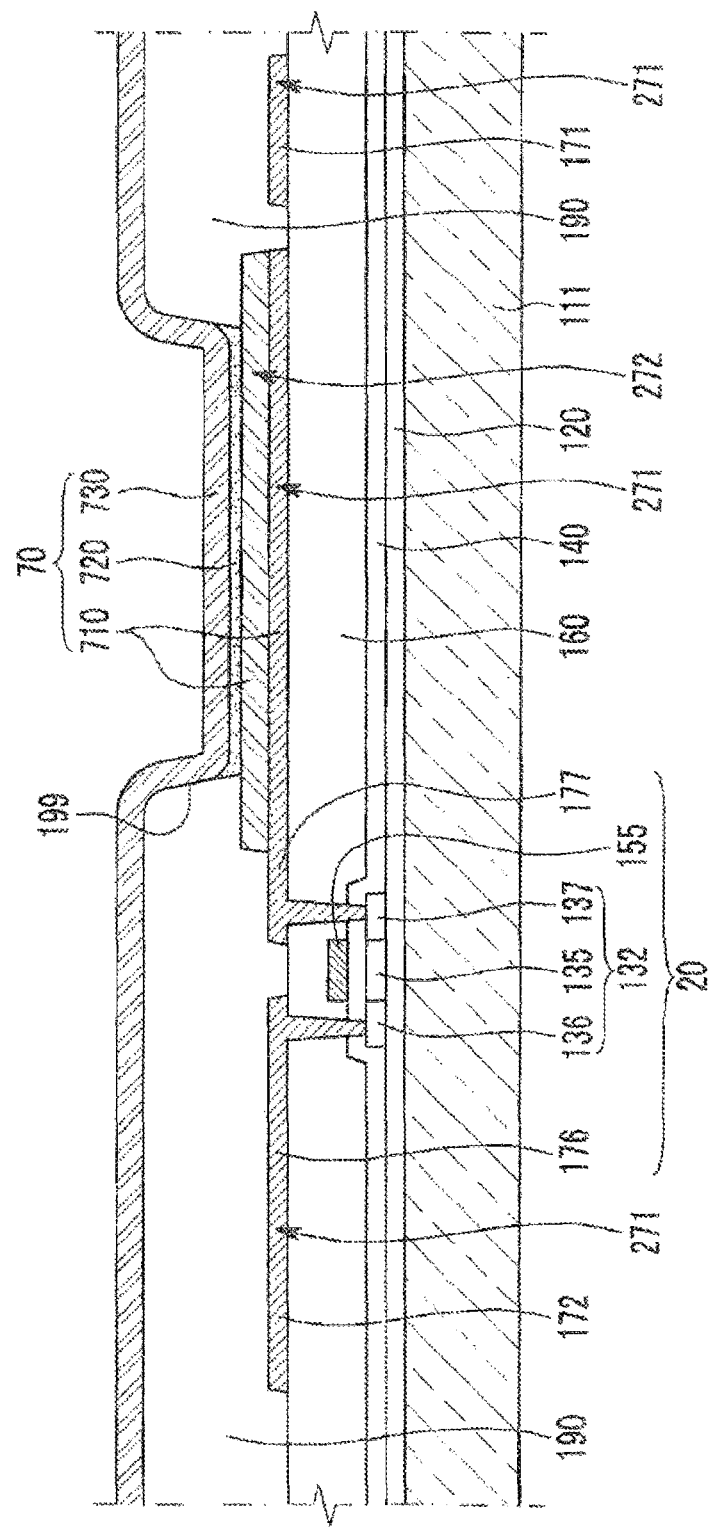
FIGS. 2A and 2B are a cross-sectional view with reference to a II-II line of FIG. 1.
Figure 2B:
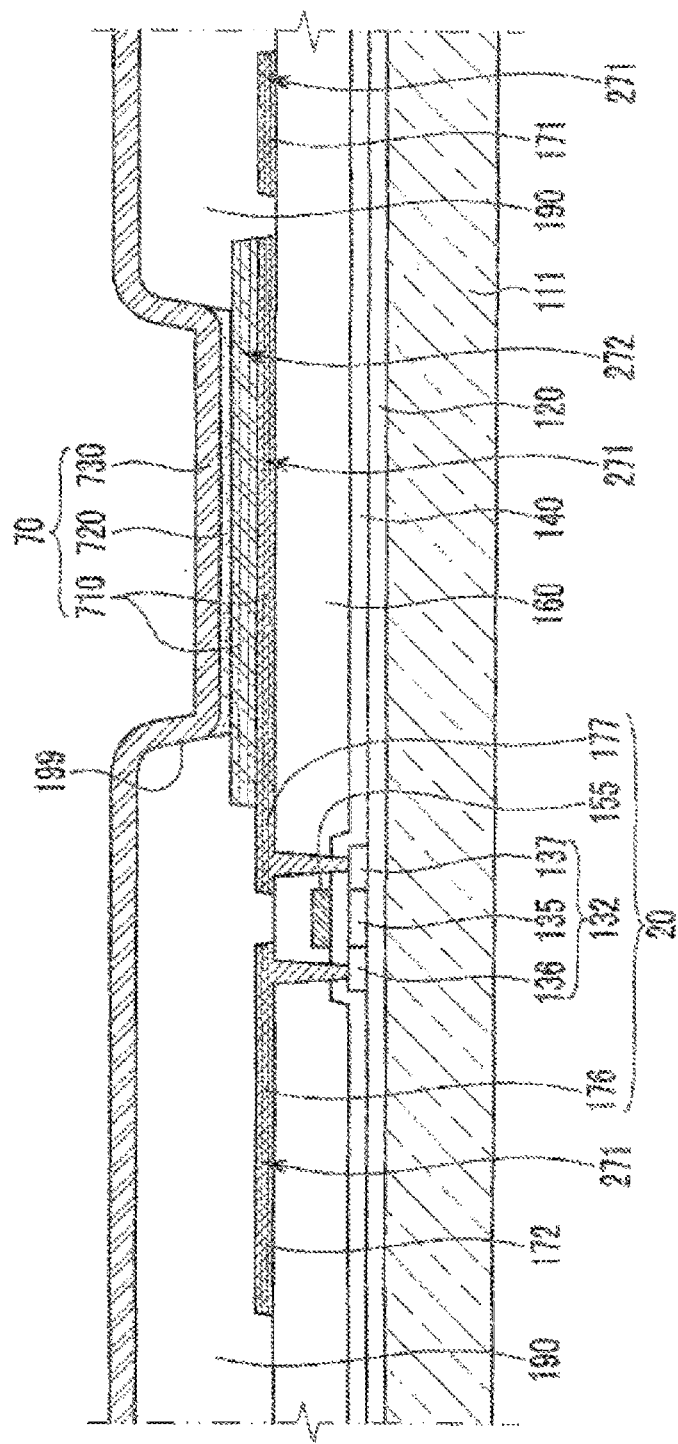

FIG. 1 is a layout view of an organic light emitting diode (OLED) display according to an exemplary embodiment, and FIGS. 2A and 2B are a cross-sectional view with reference to a II-II line of FIG. 1.

As shown in FIG. 1 and FIGS. 2A and 2B, the organic light emitting diode (OLED) display 100 includes a switching thin film transistor 10, a drive thin film transistor 20, a capacitor 80, and an organic light emitting diode (OLED) 70 per pixel. The organic light emitting diode (OLED) display 100 further includes a gate line 151 disposed in one direction, a data line 171 insulated from the gate line 151 and crossing the gate line 151, and a common power line 172. In general, one pixel can be defined by the gate line 151, the data line 171, and the common power line 172, but the present invention is not necessarily limited thereto.

The organic light emitting element 70 includes a pixel electrode 710, an organic emission layer 720 formed on the pixel electrode 710, and a common electrode 730 formed on the organic emission layer 720. Here, the pixel electrode 710 is an anode that is a hole injection electrode, and the common electrode 730 is a cathode that is an electron injection electrode. However, the exemplary embodiment is not restricted thereto, and the pixel electrode 710 can be a cathode and the common electrode 730 can be an anode according to the driving, method of the organic light emitting diode (OLED) display 100. The holes are injected into the organic emission layer 720 from the pixel electrode 710, and the electrons are injected into it from the common electrode 730. When excitons as combinations of injected holes and electrons fall to a ground state from an exited state, light is emitted. In this instance, since at least one pixel electrode 710 is formed at each pixel, the organic light emitting diode (OLED) display 100 has a plurality of separated pixel electrodes 710.

The capacitor 80 includes a first capacitor plate 158 and a second capacitor plate 178 with a gate insulation layer 140 disposed therebetween. However, the present invention is not limited thereto.

The switching thin film transistor 10 includes a switching semiconductor layer 131, a switching gate electrode 152, a switching source electrode 173, and a switching drain electrode 174. The drive thin film transistor 20 includes a drive semiconductor layer 132, a drive gate electrode 155, a drive source electrode 176, and a drive drain electrode 177.

The switching thin film transistor 10 may be used as a switch for selecting a pixel to emit light. The switching gate electrode 152 may be connected to the gate line 151, the switching source electrode 173 may be connected to the data line 171, and the switching drain electrode 174 may be separately disposed from the switching source electrode 173 and may be connected to the first capacitor plate 158.

The drive thin film transistor 20 applies drive power for emitting the organic emission layer 720 of the organic light emitting element 70 in the selected pixel to the pixel electrode 710. The drive gate electrode 155 may be connected to the first capacitor plate 158, and the drive source electrode 176 and the second capacitor plate 178 are respectively connected to the common power line 172. The pixel electrode 710 may be extended from the drive drain electrode 177 and may be electrically connected to the driving transistor 20, and may be formed on the same layer as the drive source electrode 176 and the drive drain electrode 177.

By the above-noted configuration, the switching thin film transistor 10 is operable by the gate voltage at the gate line 151, and it transmits the data voltage applied to the data line 171 to the drive thin film transistor 20. A voltage corresponding to a difference between a common voltage applied to the drive thin film transistor 20 from the common power line 172 and the data voltage transmitted by the switching thin film transistor 10 may be stored in the capacitor 80, and a current corresponding to the voltage stored in the capacitor 80 flows to the organic light emitting element 70 through the drive thin film transistor 20 to emit the organic light emitting element 70.

In the present exemplary embodiment, the switching semiconductor layer 131, the drive semiconductor layer 132, and the first capacitor plate 158 may be formed on the same layer, the switching gate electrode 152, the drive gate electrode 155, the second capacitor plate 178, and a gate wire including the gate line 151 are formed on the gate insulation layer 140, and a data wire including the switching source and drain electrodes 173 and 174, the drive source and drain electrodes 176 and 177, and the data line 170 are formed on an inter-layer insulation layer 160. Here, positions of the first and second capacitor plates 158 and 178 are not restricted to the above-described exemplary embodiment, and can be freely arranged between the gate insulation layer 140 and/or the inter-layer insulation layer 160.

In this instance, in the present exemplary embodiment, the pixel electrode 710 formed on the inter-layer insulation layer 160, the switching source and drain electrodes 173 and 174 excluding the pixel electrode 710, and the drive source and drain electrodes 176 and 177 are formed with different stacking structures, which will be described in further detail with reference to FIG. 2

FIGS. 2A and 2B illustrate an organic light emitting element 70 including a pixel electrode 710, a drive thin film transistor 20 including drive source and drain electrodes 176 and 177, and a data line 171, which will now be described. The switching semiconductor layer 131, the switching gate electrode 152, and the switching source and drain electrodes 173 and 174 of the switching thin film transistor 10 have similar configurations as the drive semiconductor layer 132, the drive gate electrode 155, and the drive source and drain electrodes 176 and 177 of the drive thin film transistor 20, and hence, corresponding description will be omitted. Also, the data line 170 formed on the inter-layer insulation layer 160 has the same stack configuration as the drive source and drain electrodes 176 and 177, and no description thereof will be provided.

The substrate main body 111 may be formed to be an insulating substrate made of glass, quartz, ceramic, or plastic. However, since the present invention is not restricted thereto, the substrate main body 111 can be formed to be a metallic substrate made of stainless steel.

A buffer layer 120 may be formed on the substrate main body 111. The buffer layer 120 functions to planarize a surface while preventing penetration of unnecessary components, and can be formed with various materials performing the function. For example, the buffer layer 120 can be made of a silicon nitride ($SiN_x$) layer, a silicon oxide ($SiO_2$) layer, or a silicon oxi nitride ($SiO_xN_y$) layer. However, the buffer layer 120 is not necessarily required, and may be omitted according to the type and process conditions of the substrate main body 111.

A drive semiconductor layer 132 is formed on the buffer layer 120. The drive semiconductor layer 132 may be formed with a polysilicon layer. However, the present invention is not restricted thereto, and the drive semiconductor layer 132 can, be made of an amorphous silicon layer.

The drive semiconductor layer 132 includes a channel region 135 to which no impurity is doped, and a source region 136 and a drain region 137 that may be formed through p+ doping on respective sides of the channel region 135.

For example, the p+ doped ion material can be boron (B), and $B_2H_6$ is used in this case. However, the present invention is not restricted thereto, and the source region 136 and the drain region 137 can be doped with various materials. Also, a PMOS thin film transistor using a P-type impurity is used for the drive thin film transistor 20 in the present exemplary embodiment, and an NMOS or CMOS thin film transistor can also be used.

A gate insulation layer 140 of silicon nitride or silicon oxide is formed on the drive semiconductor layer 132. A gate wire including the drive gate electrode 155 is formed on the gate insulation layer 140. The gate wire can include a gate line (151 in FIG. 1) and a first capacitor plate (158 in FIG. 1). In this instance, the drive gate electrode 155 is partially overlapped on the drive semiconductor layer 132, and specifically, at the channel region 135.

An inter-layer insulation layer 160 for covering the drive gate electrode 155 is formed on the gate insulation layer 140. The inter-layer insulation layer 160 is formed with the silicon nitride or silicon oxide in a like manner of the gate insulation layer 140. The gate insulation layer 140 and the inter-layer insulation layer 160 include a contact hole for revealing the source region 136 and the drain region 137 of the drive semiconductor layer 132.

A data wire including the data line 171 and the drive source and drain electrodes 176 and 177 is formed on the inter-layer insulation layer 160. The data wire may includes the data line 171, the common power line 172, the second capacitor plate (178 in FIG. 1), and the pixel electrode 170.

The drive source electrode 176 and the drive drain electrode 177 are respectively connected to the source region 136 and the drain region 137 of the drive semiconductor layer 132 through the contact holes.

Resultantly, the drive thin film transistor 20 including the drive semiconductor layer 132, the drive gate electrode 155, the drive source electrode 176, and the drive drain electrode 177 may be formed. However, the configuration of the drive thin film transistor 20 is not restricted to the above-described configuration and is changeable into various configurations.

The pixel electrode 710 formed on the inter-layer insulation layer 160 and other data wires (the drive source and drain electrodes 176 and 177 and the data line 171) except the pixel electrode 710 have different configurations so as to have different characteristics needed by the organic light emitting diode (OLED) display 100. Below, the data line 171 and the drive source and drain electrodes 176 and 177 will be exemplified as the data wire excluding the pixel electrode 710.

In further detail, the data line 171 and the drive source and drain electrodes 176 and 177 may be configured with a first conductive layer 271, and the pixel electrode 710 includes a first conductive layer 271 and a second conductive layer 272 stacked thereon.

The first conductive layer 271 installed in all the data wires including the drive source and drain electrodes 176 and 177 and the pixel electrode 710 can be formed by a corrosion-resistant material having an excellent electrical characteristic so that the current needed for light emission of the organic light emitting diode (OLED) display 100 may flow freely and no corrosion may occur at a pad that is a connecting part to an external circuit (not shown).

The second conductive layer 272 formed on the pixel electrode 710 has a better electrical characteristic than that of the first conductive layer 271, and it is formed with a material for improving a light emitting characteristic of the organic emission layer 720.

That is, the drive source electrode 176 and drive drain electrode 177 are formed with the first conductive layer 271 to prevent corrosion at the pad, and the pixel electrode 710 that is operable for light emission includes the second conductive layer 272 stacked on the first conductive layer 271 so that the organic light emitting diode (OLED) display 100 may have an excellent light emitting characteristic.

The first conductive layer 271 can be formed with aluminum, copper, molybdenum, titanium, titanium nitride, or alloys thereof. The second conductive layer 272 may be formed with a transparent conductive material, silver, aluminum, titanium, nickel, or alloys thereof. The transparent conductive material includes various materials, and for example, indium oxide, indium tin oxide (ITO), indium zinc oxide (IZO) or zinc oxide can be used for the transparent conductive material.

For example, the first conductive layer 271 may be configured with triple layers stacked with a first titanium layer, an aluminum layer, and a second titanium layer, and the second conductive layer 272 may be configured with triple layers stacked with a first indium-tin oxide layer, a silver layer, and a second indium-tin oxide layer. In this instance, the drive source and drain electrodes 176 and 177 configured with the first conductive layer 271 may be formed by stacking a first titanium layer, an aluminum layer, and a second titanium layer, and the pixel electrode 710 including the first conductive layer 271 and the second conductive layer 272 may be formed by sequentially stacking a first titanium layer, an aluminum layer, a second titanium layer, a first indium-tin oxide layer, a silver layer, and a second indium-tin, oxide layer.

Here, since the indium-tin oxide layer and the silver layer have excellent contact characteristics and the silver layer has an excellent reflection characteristic, the second conductive layer 272 configured with the first indium-tin oxide layer, the silver layer, and the second indium-tin oxide layer has a better electrical characteristic than the first conductive layer 271 configured with the first titanium layer, the aluminum layer, and the second titanium layer. Accordingly, a driving voltage of the organic light emitting diode (OLED) display 100 is reduced and luminous efficiency is improved by the pixel electrode 710 with the stacked first conductive layer 271 and second conductive layer 272. Also, the first conductive layer 271 configured with the first titanium layer, the aluminum layer, and the second titanium layer has better corrosion resistance than the second conductive layer 272 configured with the first indium-tin oxide layer, the silver layer, and the second indium-tin oxide layer, thereby preventing the pad from being corroded.

Accordingly, different characteristics needed for various electrodes may be assigned by differentiating the stacked configuration of the drive source and drain electrodes 176 and 177 and the pixel electrode 710. It is possible in the present exemplary embodiment to simplify the manufacturing process and reduce the production cost by forming the drive source and drain electrodes 176 and 177 and the pixel electrode 710 with different stacked configurations with a mask, which will be described in detail with reference to FIG. 3 to FIG. 8.

A pixel defined layer 190 for covering the data wires except the pixel electrode 710, that is, the data line 171, the common power line 172, and the drive source and drain electrodes 176 and 177, is formed on the inter-layer insulation layer 160. That is, the pixel defined layer 190 includes an opening 199 for revealing the pixel electrode 710, and covers the data wires except the opening 199. The pixel defined layer 190 can be made of a polyacrylate or polyimide resin.

An organic emission layer 720 is formed on the pixel electrode 710 in the opening 199 of the pixel defined layer 190, and a common electrode 730 is formed on, the pixel defined layer 190 and the organic emission layer 720. The pixel electrode 710, the organic emission layer 720, and the common electrode 730 configure the organic light emitting element 70.

The organic emission layer 720 is made of a low molecular organic material or a high molecular organic material. The organic emission layer 720 can be formed by a multilayer including at least one of an emission layer, a hole-injection layer (HIL), a hole-transporting layer (HTL), an electron-transporting layer (ETL), and an electron-injection layer (EIL). For example, when the multilayer includes all of them, the hole-injection layer is disposed on the positive first electrode 710, and the hole-transporting layer, the emission layer, the electron-transporting layer, and the electron-injection layer are laminated thereon in sequence.

The organic emission layer 720 is formed in the opening 199 of the pixel defined layer 190 in the present exemplary embodiment, and the present invention is not limited thereto. Therefore, at least one of the layers from among the organic emission layer 720 may be disposed between the pixel defined layer 190 and the common electrode 730 as well as on the pixel electrode 710 in the opening 199 of the pixel defined layer 190. In further detail, the hole injection layer (HIL), the hole transport layer (HTL), the electron transport layer (ETL), and the electron injection layer (EIL) of the organic emission layer 720 are formed at a part other than the opening 199 by the open mask, and the emission layer of the organic emission layer 720 may be formed at each opening 199 through a fine metal mask (FMM).

The common electrode 730 can be formed with a metallic reflective layer including at least one of lithium (Li), calcium (Ca), lithium fluoride/calcium (LiF/Ca), lithium fluoride/aluminum (LiF/Al), aluminum (Al), silver (Ag), magnesium (Mg), and gold (Au). Accordingly, the organic light emitting diode (OLED) display 100 is configured with a rear emission type in which the organic emission layer 720 emits light in the direction of the pixel electrode 710.

The drive source and drain electrodes 176 and 177 and the pixel electrode 710 with different stacked configurations are formed by using one mask in the present exemplary embodiment, which will now be described with reference to FIG. 3 to FIG. 8. The drive thin film transistor 20 and the pixel electrode 710 will be described in a like manner of the description relating to FIG. 2.

FIG. 3 to FIG. 8 are cross-sectional views of a process for sequentially manufacturing the organic light emitting diode (OLED) display shown in FIG. 2.

Figure 3:
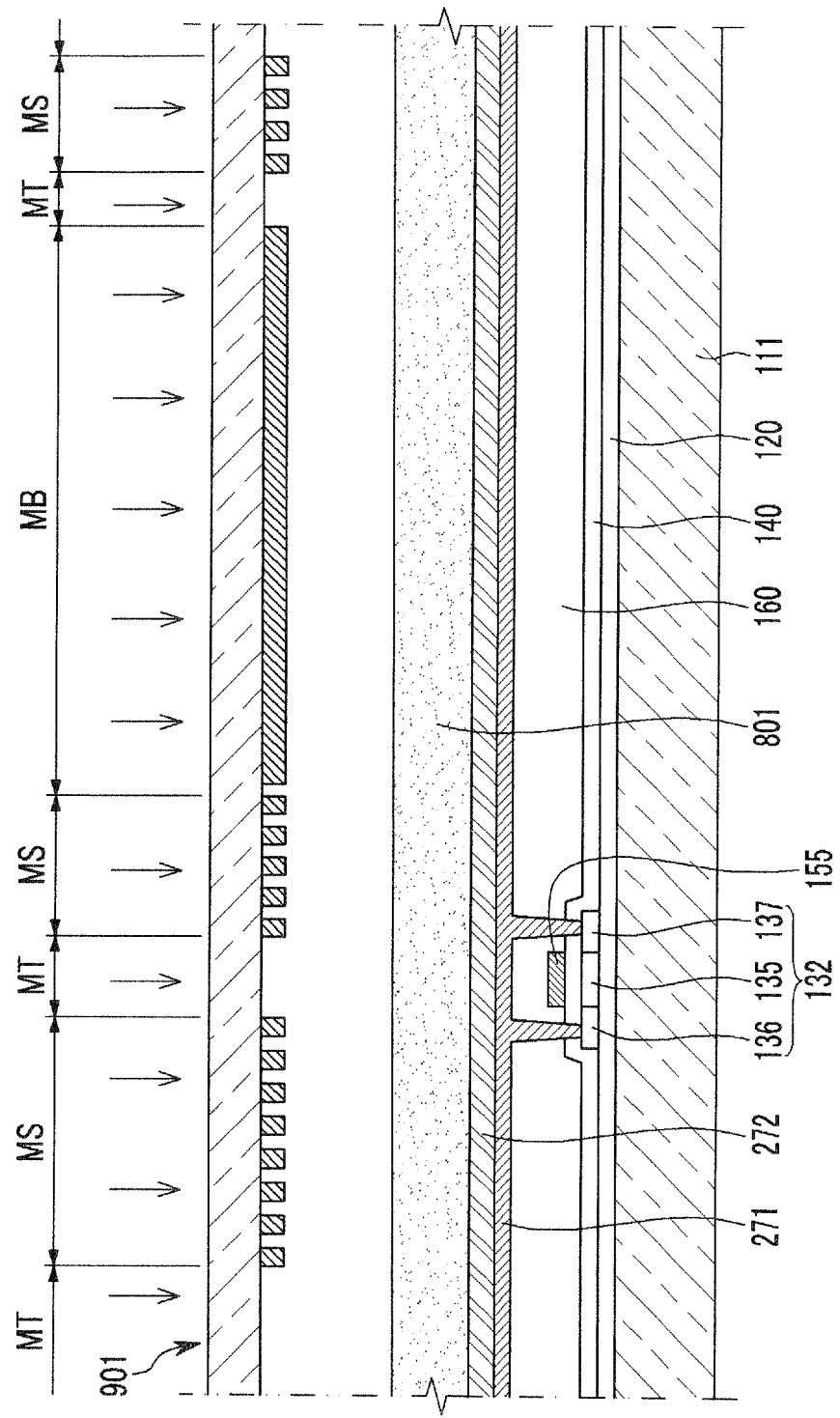
FIG. 3 to FIG. 8 are cross-sectional views for sequentially showing a manufacturing process of an organic light emitting diode (OLED) display shown in FIG. 2.

As shown in FIG. 3, a buffer layer 120 is formed on the substrate main body 111, and an amorphous silicon layer (not shown) for configuring a semiconductor layer 132 of the drive thin film transistor 20 may be coated on the buffer layer 120 and may be then patterned. A gate insulation layer 140 for covering the amorphous silicon layer is formed, and a drive gate electrode 155 may be formed on the amorphous silicon layer with a gate insulation layer 140 therebetween. The amorphous silicon layer is crystallized, and the silicon layer may be doped using the drive gate electrode 155 as a mask to thus form a semiconductor layer 132 including a channel region 135 formed below the drive gate electrode 155, and a source region 136 and a drain region 137 provided on respective sides of the channel region 135.

An inter-layer insulation layer 160 for covering the drive gate electrode 155 may be formed, and contact holes for showing the source region 136 and the drain region 137 of the semiconductor layer 132 may be formed at the inter-layer insulation layer 160 and the gate insulation layer 140. A first conductive layer 271 and a second conductive layer 272 may be sequentially formed on the inter-layer insulation layer 160 so as to contact the source region 136 and the drain region 137 of the semiconductor layer 132 through the contact holes.

A photosensitive material layer 801 may be formed on the second conductive layer 272, and halftone exposure may be performed by using the mask 901. That is, the mask 901 has a light blocking section (MB), a transparent section (MT), and a semi-transparent section (MS). The light blocking section (MB) blocks light, the transparent section (MT) transmits light, and the semi-transparent section (MS) partially blocks light and partially transmits it. The semi-transparent section (MS) is formed to be a slit pattern, and the present invention is not limited thereto.

Figure 4:
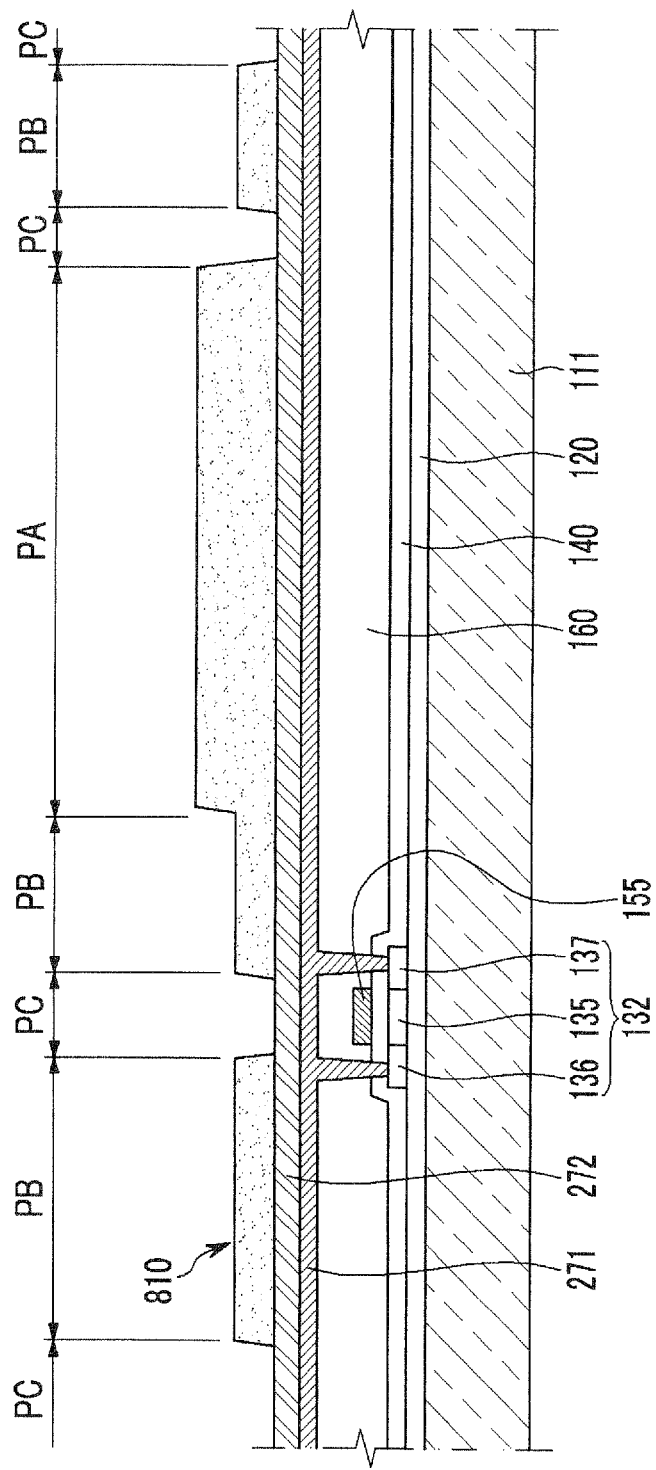

As shown in FIG. 4, the halftone exposed photosensitive material layer (801 in FIG. 3) may be developed to form a photosensitive layer pattern 810. The photosensitive layer pattern 810 includes a first part (PA) with a first thickness, a second part (PB) with a second thickness that may be less than the first thickness, and a third part (PC) substantially having no thickness. In this instance, the case in which the third part (PC) substantially has no thickness may be considered to be the case in which an attempt has been made to completely remove the photosensitive material layer 801 but a very small amount of the photosensitive material layer 801 that does not influence the subsequent process may remain.

The first part (PA) of the photosensitive layer pattern 810 corresponds to the light blocking section (MB) of the mask (901 in FIG. 3), the second part (PB) of the photosensitive layer pattern 810 corresponds to the semi-transparent section (MS) of the mask 901, and the third part (PC) of the photosensitive layer pattern 810 corresponds to the transparent section (MT) of the mask 901. That is, the part that is exposed to light is eliminated from the photosensitive pattern 810, the part that is partially exposed to light remains with relatively less thickness, and the part that is not exposed to light remains with relatively greater thickness. However, the present invention is not limited thereto. Hence, it is possible to use a photosensitive material layer in which the part exposed to light remains, and in this case, the transparent section and the light blocking section must be changed with each other in the mask 901 shown in FIG. 3.

Figure 5:
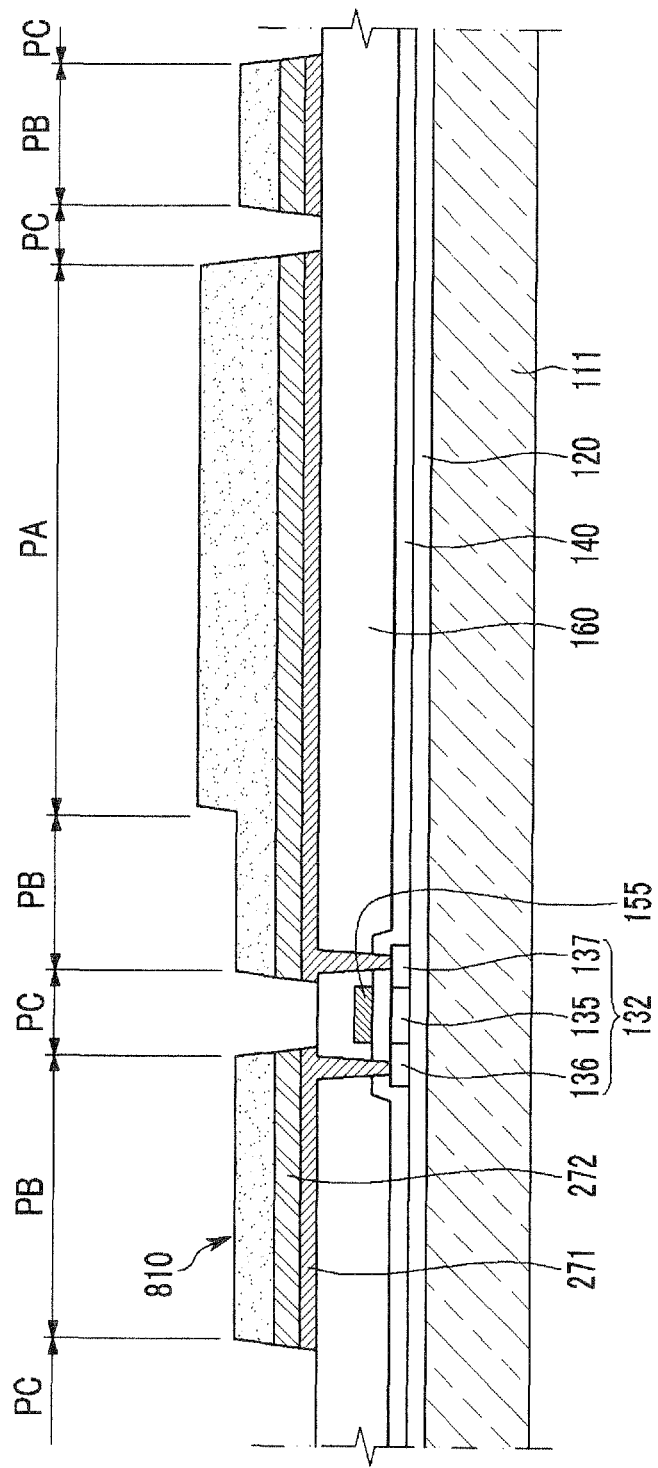

As shown in FIG. 5, the second conductive layer 272 and the first conductive layer 271 corresponding to the third part (PC) are sequentially etched and removed by using the photosensitive layer pattern 810. That is, the part corresponding to the data wire including the pixel electrode 710 and the drive source and drain electrodes 176 and 177 remains and other part is removed from the second conductive layer 272 and the first conductive layer 271.

Figure 6:
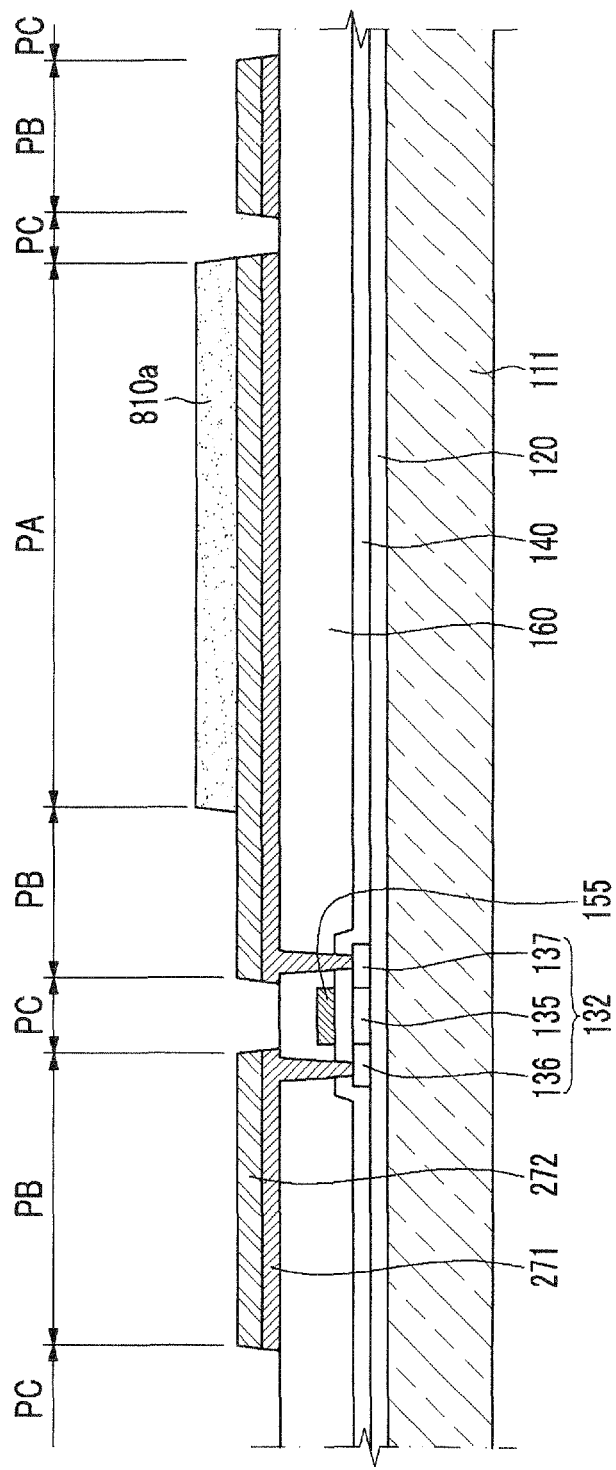

As shown in FIG. 6, the photosensitive layer pattern (810 in FIG. 5) is removed from the top by using an ashing process. Accordingly, a photosensitive layer pattern 810a in which the second part (PB) is eliminated and the first part (PA) with reduced thickness remains is formed.

Figure 7:
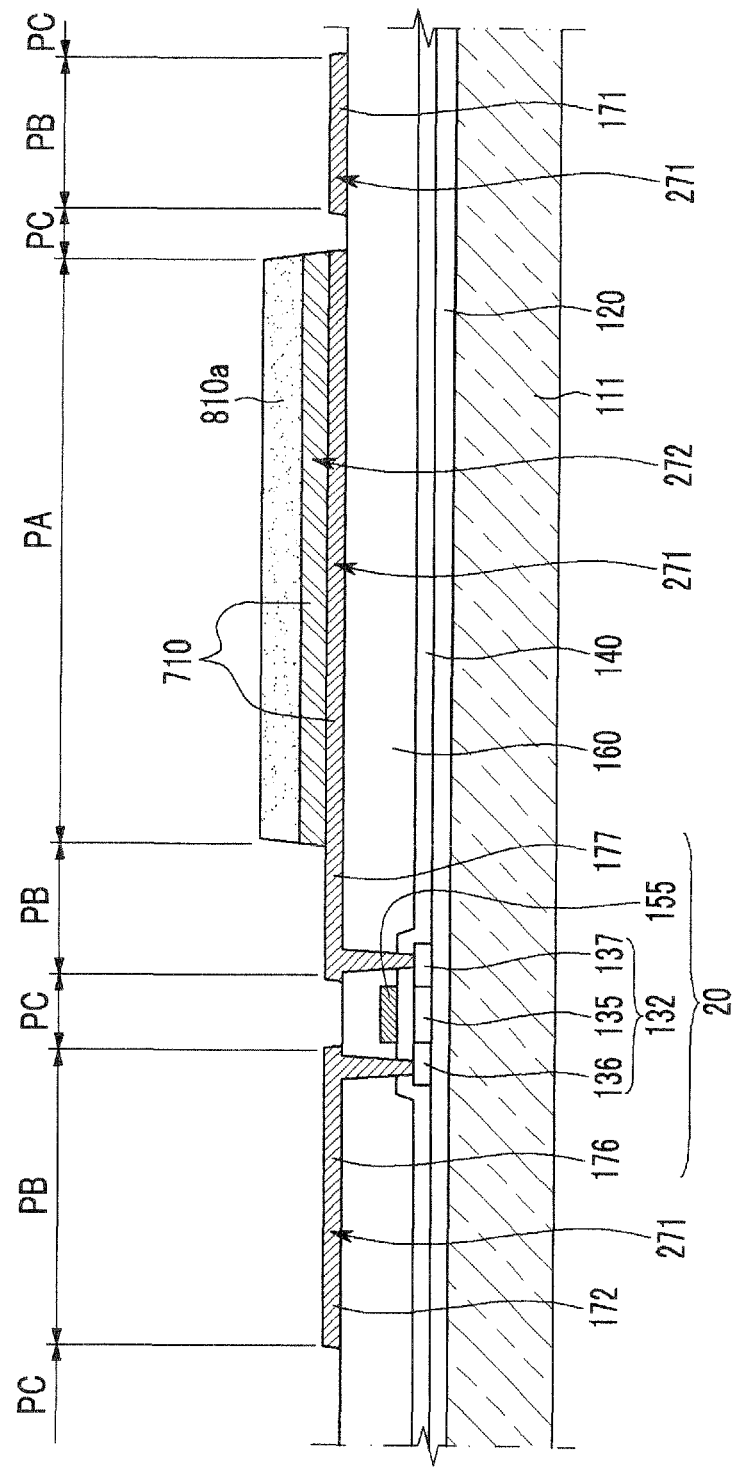

As shown in FIG. 7, the second conductive layer 272 corresponding to the second part (PB) is etched and removed by using the photosensitive layer pattern 810a having the first part (PA). The part corresponding to the second part (PB) includes the data wire except the pixel electrode 710, and in detail, it includes the drive source and drain electrodes 176 and 177 and the data line 171.

That is, in the present exemplary embodiment, the pixel electrode 710 configured by the first conductive layer 271 and the second conductive layer 272 can be formed by using one mask 901 together with the drive source and drain electrodes 176 and 177 configured by the first conductive layer 271. Therefore, the drive source and drain electrodes 176 and 177 and the pixel electrode 710 having different stacked configurations and needed characteristics for the respective parts can be formed without increasing the number of processes using the mask that is responsible for a great part of the production cost.

Figure 8:
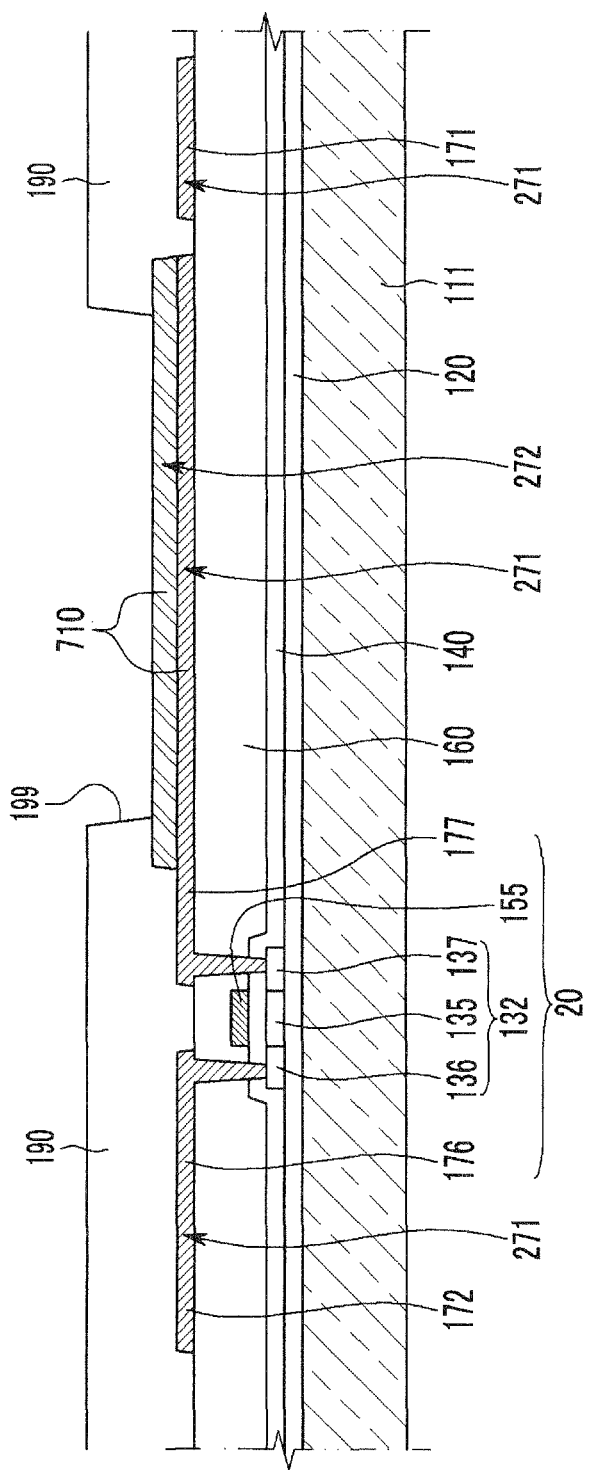

The photosensitive layer pattern 810a remaining in the first part (PA) is removed, and as shown in FIG. 8, a pixel defined layer 190 having an opening 199 for revealing the pixel electrode 710 may be formed, and an organic emission layer 720 and a common electrode 730 are sequentially formed thereon to thereby form an organic light emitting diode (OLED) display 100 as shown in FIG. 2.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:
1. An organic light emitting diode display, comprising:
   a substrate;
   a thin film transistor formed on the substrate and including a semiconductor layer, a gate electrode, a source electrode, and a drain electrode; and a pixel electrode electrically connected to the thin film transistor and formed on the same layer as the source electrode and the drain electrode; wherein the source electrode and the drain electrode include a first conductive layer, and the pixel electrode includes the first conductive layer and a second conductive layer stacked on the first conductive layer, the source electrode and the drain electrode do not include the second conductive layer.

2. The organic light emitting diode display of claim 1, wherein the semiconductor layer is formed on the substrate, a gate insulation layer is formed while covering the semiconductor layer, the gate electrode is formed in a channel region of the semiconductor layer with the gate insulation layer therebetween, an inter-layer insulation layer is formed while covering the gate electrode, and the source electrode, the drain electrode, and the pixel electrode are formed on the inter-layer insulation layer.

3. The organic light emitting diode display of claim 1, wherein the source electrode and the drain electrode are configured by the first conductive layer.

4. The organic light emitting diode display of claim 1, wherein the first conductive layer includes at least one of aluminum, copper, molybdenum, titanium, titanium nitride, and alloys thereof.

5. The organic light emitting diode display of claim 4, wherein the first conductive layer is formed by sequentially stacking a first titanium layer, an aluminum layer, and a second titanium layer.

6. The organic light emitting diode display of claim 1, wherein the second conductive layer includes at least one of a transparent conductive material, silver, aluminum, titanium, nickel, and alloys thereof.

7. The organic light emitting diode display of claim 6, wherein the second conductive layer is formed by sequentially stacking a first indium tin oxide (ITO) layer, a silver layer, and a second indium tin oxide layer.

8. A method for manufacturing an organic light emitting diode display including a substrate, a thin film transistor formed on the substrate and including a semiconductor layer, a gate electrode, a source electrode, and a drain electrode, and a pixel electrode electrically connected to the thin film transistor and formed on the same layer as the source electrode and the drain electrode, wherein, when the source electrode, the drain electrode, and the pixel electrode are formed, the source electrode and the drain electrode are formed with a first conductive layer on the substrate, and the pixel electrode is formed with the first conductive layer and a second conductive layer stacked on the first conductive layer, the source electrode and the drain electrode do not include the second conductive layer.

9. The method of claim 8, wherein the method includes, before the forming of the source electrode, the drain electrode, and the pixel electrode, comprising:

forming the semiconductor layer on the substrate;

forming a gate insulation layer while covering the semiconductor layer;

forming the gate electrode in a channel region of the semiconductor layer with the gate insulation layer therebetween;

forming an inter-layer insulation layer while covering the gate electrode; and forming a contact hole for revealing a source region and a drain region of the semiconductor layer on the inter-layer insulation layer and the gate insulation layer; and the forming of the source electrode, the drain electrode, and the pixel electrode includes:

forming the first conductive layer on the inter-layer insulation layer to contact the source region and the drain region of the semiconductor layer through the contact holes;

forming the second conductive layer on the first conductive layer; and patterning the first conductive layer and the second conductive layer.

10. The method of claim 9, wherein the patterning of the first conductive layer and the second conductive layer uses a photosensitive layer pattern formed by halftone exposure.

11. The method of claim 10, wherein the photosensitive layer pattern corresponds to a part in which the source electrode and the drain electrode will be formed, and includes a first part having a first thickness, a second part corresponding to a part in which the pixel electrode will be formed and having a second thickness that is thinner than the first part, and a third part for exposing the second conductive layer.

12. The method of claim 11, wherein the patterning of the first conductive layer and the second conductive layer includes:

forming the photosensitive layer pattern on the second conductive layer;

etching and removing the first conductive layer and the second conductive layer corresponding to the third part;

removing a photosensitive layer pattern of the second part; and etching and removing the second conductive layer corresponding to the second part.

13. The method of claim 8, wherein the first conductive layer includes at least one of aluminum, copper, molybdenum, titanium, titanium nitride, and alloys thereof.

14. The method of claim 13, wherein the first conductive layer is formed by sequentially stacking a first titanium layer, an aluminum layer, and a second titanium layer.

15. The method of claim 8, wherein the second conductive layer includes at least one of a transparent conductive material, silver, aluminum, titanium, nickel, and alloys thereof.

16. The method of claim 15, wherein the second conductive layer is formed by sequentially stacking a first indium tin oxide layer, a silver layer, and a second indium tin oxide layer.

17. An organic light emitting diode display, comprising:

a substrate;

a thin film transistor formed on the substrate and including a semiconductor layer, a gate electrode, a source electrode, and a drain electrode; and a pixel electrode electrically connected to the thin film transistor and formed on the same layer as the source electrode and the drain electrode, wherein the source electrode and the drain electrode include a first conductive layer, and the pixel electrode includes said first conductive layer and a second conductive layer stacked on the first conductive layer, said second conductive layer is transparent and has greater electrical conductivity characteristics than the first conductive layer, the source electrode and the drain electrode do not include the second conductive layer.

18. The organic light emitting diode display of claim 17, wherein the semiconductor layer is formed on the substrate, a gate insulation layer is formed while covering the semiconductor layer, the gate electrode is formed in a channel region of the semiconductor layer with the gate insulation layer therebetween, an inter-layer insulation layer is formed while covering the gate electrode, and the source electrode, the drain electrode, and the pixel electrode are formed on the inter-layer insulation layer.

19. The organic light emitting diode display of claim 18, wherein the source electrode and the drain electrode are configured by the first conductive layer.

20. The organic light emitting diode display of claim 1, wherein the first conductive layer includes at least one of aluminum, copper, molybdenum, titanium, titanium nitride, and alloys thereof, and wherein the second conductive layer includes at least one of a transparent conductive material, silver, aluminum, titanium, nickel, and alloys thereof.

* * * * *